(12) United States Patent
Chen et al.

(10) Patent No.: US 12,278,227 B2
(45) Date of Patent: Apr. 15, 2025

(54) HYBRID EMBEDDED PACKAGING STRUCTURE AND MANUFACTURING METHOD THEREOF

(71) Applicant: Zhuhai ACCESS Semiconductor Co., Ltd., Guangdong (CN)

(72) Inventors: Xianming Chen, Guangdong (CN); Lei Feng, Guangdong (CN); Benxia Huang, Guangdong (CN); Yejie Hong, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 438 days.

(21) Appl. No.: 17/807,673

(22) Filed: Jun. 17, 2022

(65) Prior Publication Data

US 2023/0052065 A1 Feb. 16, 2023

(30) Foreign Application Priority Data

Aug. 10, 2021 (CN) .......................... 202110914695.4

(51) Int. Cl.
*H01L 25/16* (2023.01)
*H01L 21/48* (2006.01)
(Continued)

(52) U.S. Cl.
CPC ........ *H01L 25/167* (2013.01); *H01L 21/4857* (2013.01); *H01L 23/053* (2013.01);
(Continued)

(58) Field of Classification Search
CPC . H01L 25/167; H01L 21/4857; H01L 23/053; H01L 23/5383; H01L 23/5384;
(Continued)

(56) References Cited

U.S. PATENT DOCUMENTS 7,842,541 B1 * 11/2010 Rusli ................ H01L 23/49816
438/106
9,406,658 B2 * 8/2016 Lee ..................... H01L 23/5389
(Continued)

FOREIGN PATENT DOCUMENTS

KR 20170072425 A 6/2017
KR 20170093277 A 8/2017
(Continued)

OTHER PUBLICATIONS

Office Action of Taiwanese Patent Application No. 111119574 mailed Jul. 21, 2023, 4 pgs with translations.
(Continued)

*Primary Examiner* — Vu A Vu
(74) *Attorney, Agent, or Firm* — Buchalter; Jason W. Croft (57) ABSTRACT

A hybrid embedded packaging structure and a manufacturing method thereof are disclosed. The structure includes: a substrate with a first insulating layer, a conductive copper column, a chip-embedded cavity and a first circuit layer; a first electronic device arranged inside the chip-embedded cavity; a second electronic device arranged on a back surface of the first electronic device; a second insulating layer covering and filling the chip-embedded cavity and an upper layer of the substrate, exposing part of the first circuit layer and a back surface of part of the second electronic device or part of the first electronic device; a second circuit layer electrically connected with the conductive copper column and a terminal of the first electronic device; a conducting wire electrically connecting the first circuit layer with a terminal of the second electronic device; and a protection cover arranged on the top surface of the substrate.

17 Claims, 9 Drawing Sheets

(51) Int. Cl.
*H01L 23/00* (2006.01)
*H01L 23/053* (2006.01)
*H01L 23/538* (2006.01)

(52) U.S. Cl.
CPC ...... *H01L 23/5383* (2013.01); *H01L 23/5384* (2013.01); *H01L 23/5386* (2013.01); *H01L 24/29* (2013.01); *H01L 24/32* (2013.01); *H01L 24/48* (2013.01); *H01L 24/73* (2013.01); *H01L 24/92* (2013.01); *H01L 24/45* (2013.01); *H01L 24/85* (2013.01); *H01L 2224/29099* (2013.01); *H01L 2224/32145* (2013.01); *H01L 2224/45144* (2013.01); *H01L 2224/45147* (2013.01); *H01L 2224/48158* (2013.01); *H01L 2224/73265* (2013.01); *H01L 2224/85399* (2013.01); *H01L 2224/92247* (2013.01)

(58) Field of Classification Search
CPC ..... H01L 23/5386; H01L 24/29; H01L 24/32; H01L 24/48; H01L 24/73; H01L 24/92; H01L 24/45; H01L 24/85; H01L 2224/29099; H01L 2224/32145; H01L 2224/45144; H01L 2224/45147; H01L 2224/48158; H01L 2224/73265; H01L 2224/85399; H01L 2224/92247; H01L 2221/68345; H01L 2221/68359; H01L 21/6835; H01L 23/5389; H01L 24/18; H01L 21/4846; H01L 23/49811; H01L 2224/85; H01L 21/4803; H01L 21/4853; H01L 21/486; H01L 23/13; H01L 25/042; H01L 25/043; H01L 25/0756; H01L 25/165

USPC ........................................................ 257/668
See application file for complete search history.

(56) References Cited

U.S. PATENT DOCUMENTS

| 9,640,473 | B2* | 5/2017 | Sung .................... H01L 23/5389 |
| 9,735,128 | B2* | 8/2017 | Karpman ................ H01L 24/80 |
| 10,045,444 | B2* | 8/2018 | Lee ...................... H05K 3/4697 |
| 10,153,219 | B2* | 12/2018 | Jeon ..................... H01L 23/5385 |
| 10,566,257 | B2* | 2/2020 | Kurahashi ......... H01L 23/49838 |
| 10,925,161 | B2* | 2/2021 | Ko .......................... H05K 3/305 |
| 11,289,452 | B2* | 3/2022 | Mok ....................... H01L 21/56 |
| 11,569,178 | B2* | 1/2023 | Kim ........................ A61N 1/375 |
| 11,610,851 | B2* | 3/2023 | Talledo ............... H01L 23/5389 |
| 2007/0096292 | A1* | 5/2007 | Machida ............. H01L 21/4857 |
|  |  |  | 257/E23.105 |
| 2015/0061139 | A1 | 3/2015 | Yap |
| 2019/0237382 | A1 | 8/2019 | Kim et al. |
| 2020/0006293 | A1 | 1/2020 | Sankman et al. |

FOREIGN PATENT DOCUMENTS

| KR | 20180054019 A | 5/2018 |
| KR | 20200120374 A | 10/2020 |
| KR | 20210026539 A | 3/2021 |

OTHER PUBLICATIONS

Search Report of Taiwanese Patent Application No. 111119574 mailed Jul. 21, 2023, 4 pgs with translations.
Office Action of Korean Patent Application No. 10-2022-0073642 mailed Jun. 19, 2024, 17 pgs with translations.

* cited by examiner

HYBRID EMBEDDED PACKAGING STRUCTURE AND MANUFACTURING METHOD THEREOF

CROSS-REFERENCE TO RELATED APPLICATION

This application is based on and claims the benefit of priority from Chinese Patent Application No. 2021109146954, filed on 10 Aug. 2021, the entirety of which is incorporated by reference herein.

TECHNICAL FIELD

The disclosure relates to the technical field of semiconductor packaging, and more particularly, to a hybrid embedded packaging structure and a manufacturing method thereof.

BACKGROUND

With the development and progress of electronic technology, electronic products are becoming short and thin, and functions of the electronic products are required to be more powerful, which promotes packaging structures of the electronic products to develop towards high integration and miniaturization, and embedded packaging of an electronic device and other components comes into being, showing a trend of gradually replacing WB packaging (wire bonding packaging). However, relatively speaking, for an electronic device with a small number of I/O, compared with the embedded packaging after which RDL (redistribution layer) is manufactured, the WB packaging has more advantages in cost and processing period. Moreover, it is difficult for some devices to realize special applications by embedded packaging. For example, for devices such as LEDs, photodiodes which involve light emitting from a light source or light receiving, both light emitting and light receiving of the devices will be affected after embedded packaging by a traditional method. Therefore, the WB packaging will still play an important role in a short time.

In the existing technology, the traditional WB packaging method includes fixing an electronic device and other components on a surface of a substrate by attaching, then performing wire bonding to electrically connect the electronic device and other components with the substrate, and finally performing packaging through injection molding. This method is defective in that: the packaging volume is enlarged due to that the electronic device and other components are attached to the surface of the substrate and the use of wire bonding, which cannot meet the development requirements of high-density integration and miniaturization.

The traditional embedded packaging method of an electronic device includes attaching the electronic device and other components to a polymer frame or a Core material of a preset cavity, and manufacturing the RDL (redistribution layer) after packaging with a plastic packaging material. This method is defective in that: for the electronic device with a small number of I/O, compared with the WB packaging, the embedded packaging after which RDL is manufactured has a higher cost and a longer processing period. Moreover, it is difficult for some devices to realize special applications by embedded packaging. For example, for devices such as LEDs, photodiodes which involve light emitting from a light source or light receiving, both light emitting and light receiving of the devices will be affected after embedded packaging by a traditional method.

SUMMARY

The disclosure aims to solve at least one of the technical problems in related art to some extent. Therefore, the disclosure provides a hybrid embedded packaging structure and a manufacturing method thereof, through hybrid embedded packaging which combines embedded packaging with WB packaging, a package may meet special packaging requirements of special devices while achieving high integration and miniaturization, and a summary of a subject described in detail herein is made hereinafter. The summary is not intended to limit the scope of protection of the claims. The technical solutions are as follows.

In a first aspect, an embodiment of the disclosure provides a manufacturing method of a hybrid embedded packaging structure, including:

manufacturing a substrate, wherein the substrate includes a first insulating layer, a conductive copper column penetrating through the first insulating layer, a chip-embedded cavity formed in the first insulating layer and a first circuit layer electrically connected with the conductive copper column;

arranging a supporting member on a bottom of the substrate, wherein the supporting member is configured for pre-fixing an electronic device assembly;

pre-fixing the electronic device assembly on an inner side of the supporting member corresponding to the chip-embedded cavity, wherein the electronic device assembly includes a first electronic device and a second electronic device, the second electronic device is arranged on a back surface of the first electronic device, a terminal surface of the first electronic device faces the supporting member, and a terminal surface of the second electronic device faces away from the first electronic device;

packaging the electronic device assembly, with a part of the first circuit layer and a terminal of the second electronic device exposed to form a second insulating layer;

removing the supporting member;

manufacturing a second circuit layer on the bottom of the substrate; and performing wire bonding to connect the terminal of the second electronic device with the first circuit layer.

The manufacturing method of a hybrid embedded packaging structure according to the embodiment in the first aspect of the disclosure has at least the following beneficial effects. In a first aspect, according to the manufacturing method of a hybrid embedded packaging structure provided by the disclosure, embedded packaging is combined with WB packaging, and the embedded packaging or the WB packaging (wire bonding) is selectively performed on an electronic device and other components to be packaged, which can reduce a production cost and shorten a processing period. In a second aspect, a sensor and a light sensing device (LED and PD) may be integrated inside the substrate, and the sensor and the light sensing device may be exposed, so that a packaging volume can be reduced, without affecting signal sending/receiving of the sensor and the light sensing device. In a third aspect, the second electronic device to be subjected to WB is fixed on the back surface of the embedded first electronic device, and then the second electronic device subjected to WB is electrically connected with the substrate by wire bonding.

In some embodiments of the disclosure, the manufacturing method further includes: manufacturing a solder mask on the bottom of the substrate and a surface of at least a part of the second circuit layer; and performing surface processing on the first circuit layer and the second circuit layer to form respective surface-processed layers.

In some embodiments of the disclosure, the manufacturing method further includes adding a protection cover on a top surface of the substrate.

In some embodiments of the disclosure, manufacturing a substrate includes:
- preparing a bearing plate, wherein the bearing plate sequentially includes a core layer, a first metal layer, a second metal layer, an etching barrier layer and a first metal seed layer from bottom to top;
- manufacturing a first photoresist layer on a surface of the first metal seed layer, wherein the first photoresist layer is provided with a conductive copper column window and a sacrificial copper column window;
- respectively manufacturing a conductive copper column and a sacrificial copper column at positions corresponding to the conductive copper column window and the sacrificial copper column window;
- removing the first photoresist layer;
- forming the first insulating layer by laminating which covers the copper columns and is thinned to exposed end portions of the conductive copper column and the sacrificial copper column;
- manufacturing a second metal seed layer on a surface where the copper columns are exposed;
- forming a second photoresist layer by applying a photoresist material on a surface of the second metal seed layer, exposing and developing the photoresist material, and manufacturing a first circuit layer pattern;
- electroplating a circuit, and removing the second photoresist layer and an exposed part of the second metal seed layer to form the first circuit layer;
- splitting the first metal layer from the second metal layer;
- removing the second metal layer, the etching barrier layer and the first metal seed layer;
- applying photoresist materials on both sides, exposing and developing the photoresist materials to cover the first circuit layer and the conductive copper column, and expose the sacrificial copper column; and
- removing the sacrificial copper column to form the chip-embedded cavity.

In some embodiments of the disclosure, the first electronic device and the second electronic device are connected through an adhesive material.

In some embodiments of the disclosure, a terminal board of the second electronic device is further provided with a sensor.

In some embodiments of the disclosure, packaging an electronic device assembly, with a part of the first circuit layer and a terminal of the second electronic device exposed to form the second insulating layer, includes:
- packaging the electronic devices with an insulating material; and
- processing the insulating material, and exposing the part of the first circuit layer, the terminal of the second electronic device and the sensor to form the second insulating layer.

In some embodiments of the disclosure, the insulating material for the second insulating layer is a photosensitive insulating material, and by exposing and developing the photosensitive insulating material, the part of the first circuit layer, the terminal of the second electronic device and the sensor are exposed to form the second insulating layer.

In some embodiments of the disclosure, manufacturing a second circuit layer on the bottom of the substrate includes:
- manufacturing a third metal seed layer on a bottom surface of the substrate;
- applying photoresist materials on both sides by pasting or coating;
- forming a fifth photoresist layer and a sixth photoresist layer by exposing and developing the photoresist materials to fully covering a top surface and form a second circuit layer pattern on the bottom surface;
- electroplating a second circuit;
- removing the fifth photoresist layer and the sixth photoresist layer; and
- forming the second circuit layer by etching the metal seed layer to remove a exposed part of the third metal seed layer.

In some embodiments of the disclosure, the first insulating layer is made of a pure resin or an organic insulating material containing a resin and a glass fiber.

In a second aspect, an embodiment of the disclosure provides a manufacturing method of a hybrid embedded packaging structure, including:
- manufacturing a substrate, wherein the substrate includes a first insulating layer, a conductive copper column penetrating through the first insulating layer, a chip-embedded cavity formed in the first insulating layer and a first circuit layer electrically connected with the conductive copper column;
- arranging a supporting member on a bottom of the substrate;
- pre-fixing a first electronic device on an inner side of the supporting member corresponding to the chip-embedded cavity, wherein a terminal surface of the first electronic device faces the supporting member;
- packaging the first electronic device, with a part of the first circuit layer and a back surface of the first electronic device exposed to form a second insulating layer, wherein the second insulating layer is provided with at least two windows on the back surface of the first electronic device;
- removing the supporting member;
- manufacturing a second circuit layer on the bottom of the substrate; and
- arranging a second electronic device at the window of the second insulating layer on the back surface of the first electronic device, wherein a terminal surface of the second electronic device faces away from the first electronic device; and
- performing wire bonding to connect a terminal of the second electronic device with the first circuit layer.

In some embodiments of the disclosure, the manufacturing method further includes: manufacturing a solder mask on the bottom of the substrate and a surface of at least a part of the second circuit layer; and performing surface processing on the first circuit layer and the second circuit layer to form respective surface-processed layers.

In some embodiments of the disclosure, the manufacturing method further includes adding a protection cover on a top surface of the substrate.

The manufacturing method of a hybrid embedded packaging structure according to the embodiment in the second aspect of the disclosure has at least the following beneficial effects. In a first aspect, according to the manufacturing method of a hybrid embedded packaging structure provided by the disclosure, embedded packaging is combined with WB packaging, and the embedded packaging or the WB packaging (wire bonding) is selectively performed on an electronic device and other components to be packaged, which can reduce a production cost and shorten a processing period; In a second aspect, a sensor and a light sensing device (LED and PD) may be integrated inside the substrate, and the sensor and the light sensing device may be exposed, so that a packaging volume can be reduced, without affecting signal sending/receiving of the sensor and the light sensing device. In a third aspect, the second electronic device to be subjected to WB is fixed on the back surface of the embedded first electronic device, and then the second electronic device subjected to WB is electrically connected with the substrate by wire bonding; and in a fourth aspect, a plurality of second electronic devices to be subjected to WB may be provided as required, a type of each electronic device may be arbitrarily matched, and the types may be the same or different, thus having a very flexible design.

In a third aspect, an embodiment of the disclosure provides a hybrid embedded packaging structure, including:

a substrate, wherein the substrate includes a first insulating layer, a conductive copper column penetrating through the first insulating layer, a chip-embedded cavity formed in the first insulating layer and a first circuit layer electrically connected with the conductive copper column;

a first electronic device arranged inside the chip-embedded cavity, wherein a terminal surface of the first electronic device faces a bottom surface of the substrate;

a second electronic device arranged on a back surface of the first electronic device, wherein a terminal surface of the second electronic device faces a top surface of the substrate;

a second insulating layer covering and filling the chip-embedded cavity and an upper layer of the substrate, and exposing a part of the first circuit layer and a back surface of a part of the second electronic device or a part of the first electronic device;

a second circuit layer arranged on the bottom surface of the substrate, wherein the second circuit layer is electrically connected with the conductive copper column and a terminal of the first electronic device; and a conducting wire electrically connecting the first circuit layer with a terminal of the second electronic device.

The hybrid embedded packaging structure according to the embodiment in the third aspect of the disclosure has at least the following beneficial effects. In a first aspect, according to the manufacturing method of a hybrid embedded packaging structure provided by the disclosure, embedded packaging is combined with WB packaging, and the embedded packaging or the WB packaging (wire bonding) is selectively performed on an electronic device and other components to be packaged, which can reduce a production cost and shorten a processing period. In a second aspect, a sensor and a light sensing device (LED and PD) may be integrated inside the substrate, and the sensor and the light sensing device may be exposed, so that a packaging volume can be reduced, without affecting signal sending/receiving of the sensor and the light sensing device. In a third aspect, the second electronic device to be subjected to WB is fixed on the back surface of the embedded first electronic device, and then the second electronic device subjected to WB is electrically connected with the substrate by wire bonding; and in a fourth aspect, a plurality of second electronic devices to be subjected to WB may be provided as required, a type of each electronic device may be arbitrarily matched, and the types may be the same or different, thus having a very flexible design.

In some embodiments of the disclosure, one second electronic device is provided, and the second insulating layer covers and fills the chip-embedded cavity and the upper layer of the substrate, and exposes the part of the first circuit layer and the terminal of the second electronic device.

In some embodiments of the disclosure, the terminal surface of the second electronic device is further provided with a sensor, and the second insulating layer covers and fills the chip-embedded cavity and the upper layer of the substrate, and exposes the part of the first circuit layer, the terminal of the second electronic device and the sensor.

In some embodiments of the disclosure, at least two second electronic devices are provided, the second insulating layer covers and fills the chip-embedded cavity and the upper layer of the substrate, and exposes the part of the first circuit layer and a back surface of the part of the first electronic device, the second insulating layer is provided with at least two windows on the back surface of the first electronic device, and each second electronic device is arranged in the corresponding window.

In some embodiments of the disclosure, the at least two second electronic devices are same electronic components or different electronic components.

In some embodiments of the disclosure, the second electronic device is arranged on the back surface of the first electronic device through an adhesive material.

In some embodiments of the disclosure, the hybrid embedded packaging structure further includes a solder mask at least partially covering the second circuit layer.

In some embodiments of the disclosure, the hybrid embedded packaging structure further includes a protection cover arranged on the top surface of the substrate.

In some embodiments of the disclosure, the protection cover is a light-transmitting cover.

Other features and advantages of the disclosure will be stated in the following specification, and are partially obvious from the specification, or are learned by implementing the disclosure. The objects and other advantages of the disclosure may be implemented and obtained by the structure particularly pointed out in the specification, the claims and the drawings.

BRIEF DESCRIPTION OF THE DRAWINGS

The drawings are provided to further understand the technical solutions of the disclosure and constitute a part of the specification. The drawings are used together with the embodiments of the disclosure to explain the technical solutions of the disclosure, but are not intended to limit the technical solutions of the disclosure.

DETAILED DESCRIPTION

To make the objectives, the technical solutions, and the advantages of the disclosure clearer, the disclosure is further described in detail hereinafter with reference to the accompanying drawings and the embodiments. It should be understood that the embodiments described herein are only used to explain the disclosure, and are not intended to limit the disclosure, thus having no substantive significance in technology. Any structural modification, change of scale relationship, or adjustment of size should still fall within the scope covered by the technical contents in the disclosure without affecting the effect and the goal achieved by the disclosure.

This part will describe some embodiments of the disclosure in detail with reference to the drawings. The drawings are used to supplement the description of the text in the specification with the graphs, so that people can intuitively and vividly understand each technical feature and the overall technical solution of the disclosure, but the drawings cannot be understood as limiting the scope of protection of the disclosure.

In the description of the disclosure, the term "several" refers to one or more, and the term "a plurality of" refers to two or more. The terms "greater than", "less than", "more than", and the like are understood as not including this number, while the terms "above", "below", "within", and the like are understood as including this number. The terms "first" and "second" if referred to are only for the purpose of distinguishing technical features, and should not be understood as indicating or implying relative importance, implicitly indicating the number of the indicated technical features or implicitly indicating the order of the indicated technical features.

Figure 1:
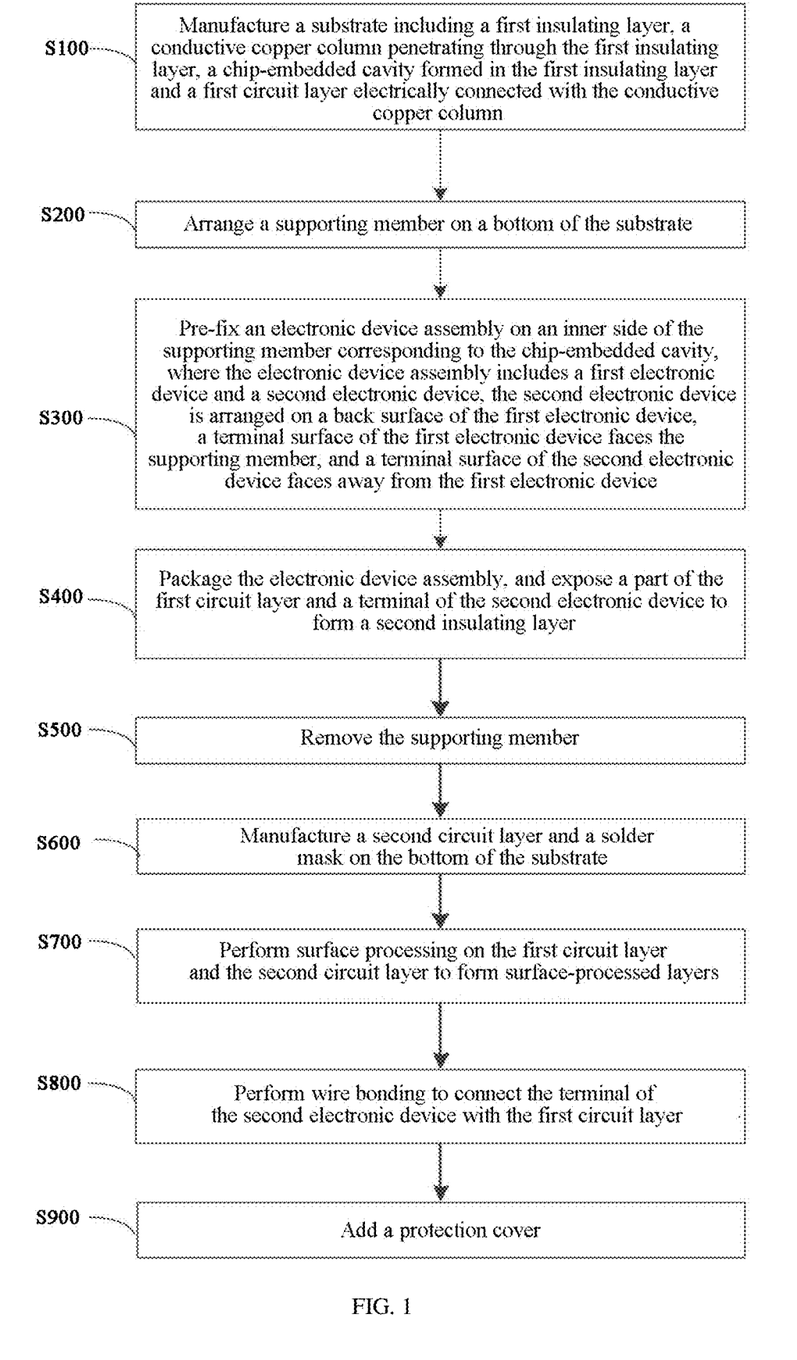
FIG. 1 is a flow chart of steps of a manufacturing method of a hybrid embedded packaging structure provided by a first embodiment of the disclosure.

With reference to FIG. 1, an embodiment of the disclosure provides a manufacturing method of a hybrid embedded packaging structure, which includes the following steps.

In S100, a substrate 500 is manufactured, wherein the substrate includes a first insulating layer 502, a conductive copper column 501 penetrating through the first insulating layer 502, a chip-embedded cavity 504 formed in the first insulating layer 502 and a first circuit layer 503 electrically connected with the conductive copper column 501, which is specifically shown in FIG. 2 to FIG. 11.

Figure 2:
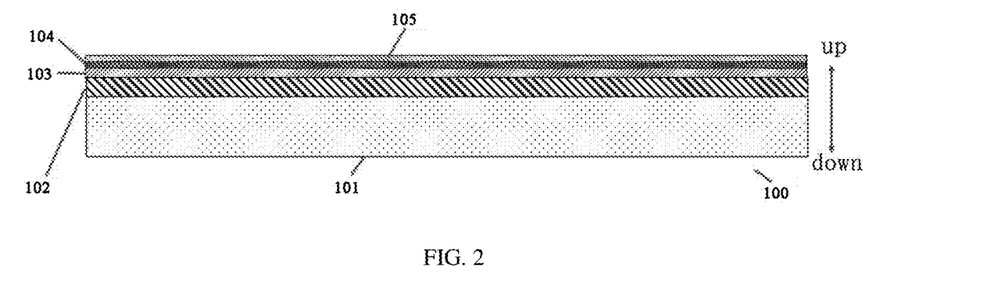
FIG. 2 to FIG. 17 are cross-sectional views of a manufacturing method of a packaging substrate provided by the first embodiment of the disclosure.

Further, with reference to FIG. 2, a bearing plate 100 is prepared, wherein the bearing plate sequentially includes a core layer 101, a first metal layer 102, a second metal layer 103, an etching barrier layer 104 and a first metal seed layer 105 from bottom to top. In some embodiments, the first metal layer 102 and the second metal layer 103 may be metal copper layers, which are physically combined and separable. After the first and second metal layers 102 and 103 are separated subsequently, when the second metal layer 103 is etched, the etching barrier layer 104 may protect the circuits and the copper columns of the substrate to prevent over etching. The etching barrier layer 104 may be made of metal nickel. The first metal seed layer 105 may be made of copper, with a thickness of 1 um to 3 um, as a conducting basis for subsequent electroplating.

Figure 3:
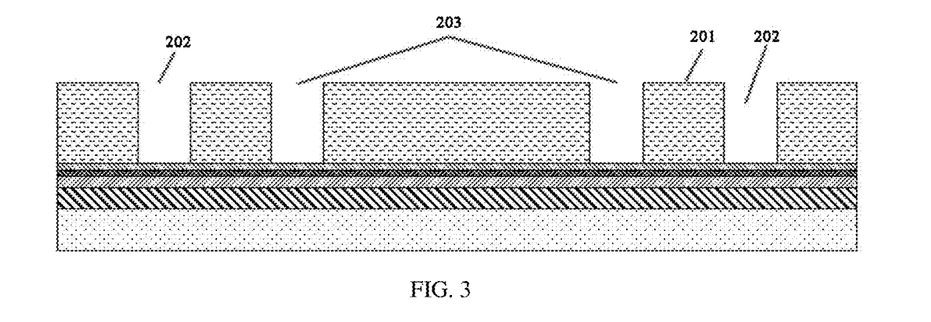

Further, with reference to FIG. 3, a first photoresist layer 201 is manufactured on a surface of the first metal seed layer 105. The first photoresist layer 201 is provided with a conductive copper column window 202 and a sacrificial copper column window 203. Specifically, a photoresist material is applied on the surface of the first metal seed layer 105, which may be realized by pasting or coating, the photoresist material is exposed and developed, and a copper column pattern is manufactured to form the first photoresist layer 201. The first photoresist layer 201 includes the conductive copper column window 202 and the sacrificial copper column window 203, and the copper columns are not limited to cylinders, but may be cubes or cuboids.

Figure 4:
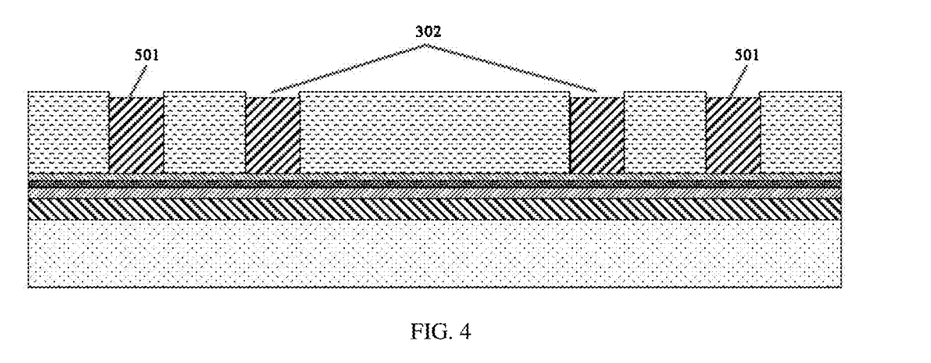

Further, with reference to FIG. 4, the copper columns are electroplated. The conductive copper column 501 and a sacrificial copper column 302 are respectively manufactured at positions corresponding to the conductive copper column window 202 and the sacrificial copper column window 203. Thicknesses of the copper columns 501 and 302 are defined according to actual requirements, which are typically lower than that of the first photoresist layer 201.

Figure 5:
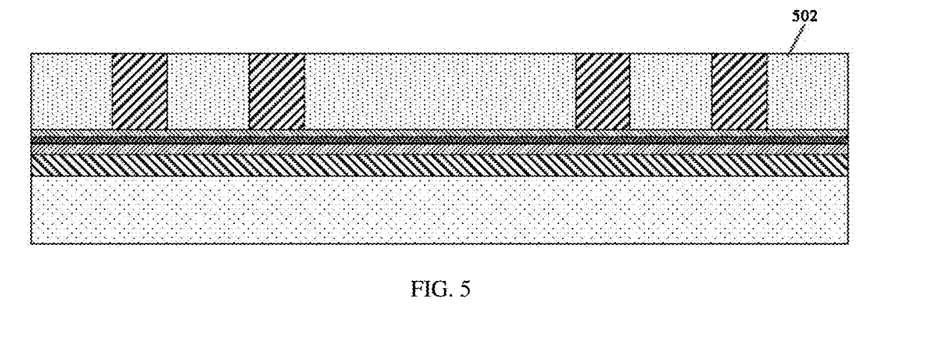

Further, with reference to FIG. 5, the first photoresist layer is removed, and may be removed by stripping. An insulating layer is laminated, to cover the copper columns, and the first photoresist layer may be removed by stripping. The insulating layer is thinned, and end portions of the conductive copper column 501 and the sacrificial copper column 302 may be exposed by plasma etching or boar grinding to form the first insulating layer 502.

Figure 6:
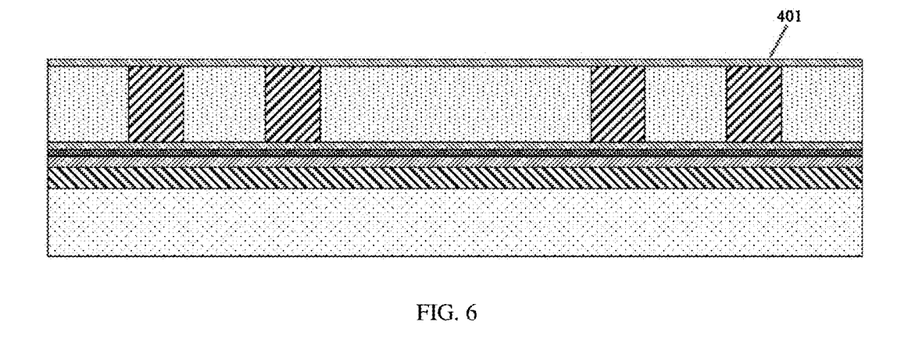

Further, with reference to FIG. 6, a second metal seed layer 401 is manufactured on a surface where the copper columns are exposed, which may be realized by copper plating or ion sputtering in some embodiments, and the second metal seed layer 401 may be Cu or Ti+Cu.

Figure 7:
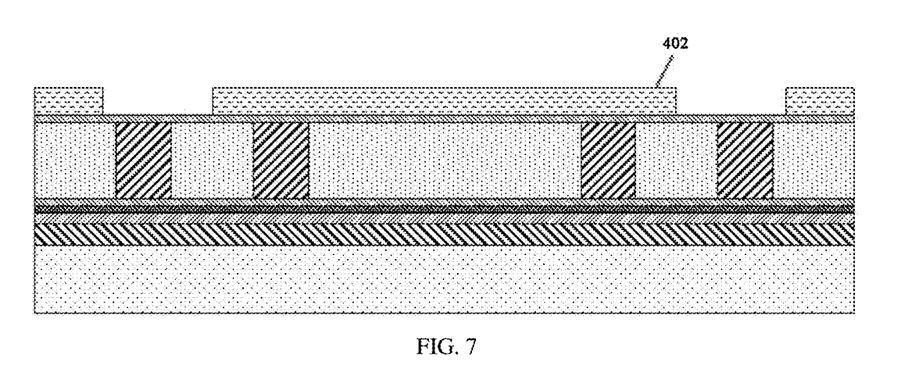

Further, with reference to FIG. 7, a photoresist material is applied on a surface of the second metal seed layer, which may be realized by pasting or coating in some embodiments, the photoresist material is exposed and developed, and a first circuit layer pattern is manufactured to form a second photoresist layer 402.

Figure 8:
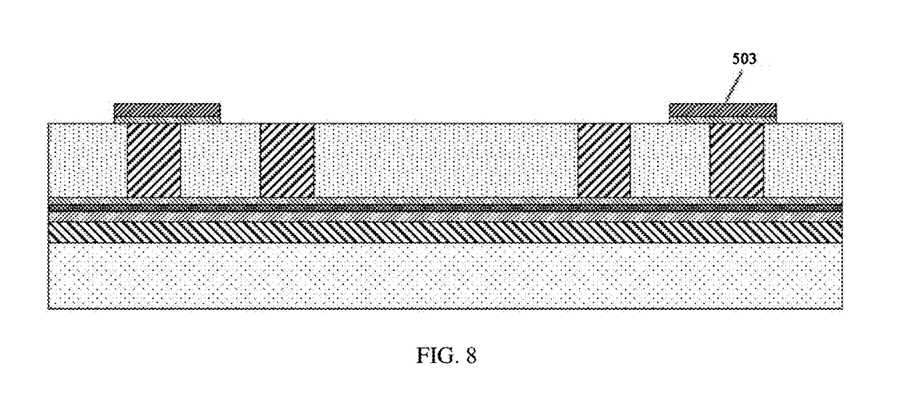

Further, with reference to FIG. 8, the circuits are electroplated, with thicknesses defined according to actual requirements, which are typically lower than that of the second photoresist layer 402, and the second photoresist layer 402 and the exposed second metal seed layer 401 are removed to form the first circuit layer 503. The second photoresist layer may be removed by stripping in some embodiments, and the exposed second metal seed layer is removed by etching.

Figure 9:
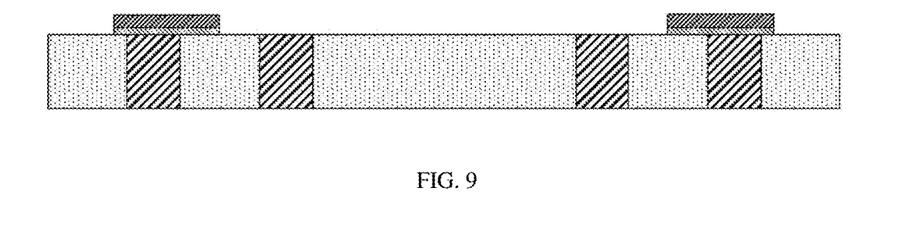

Further, with reference to FIG. 9, the first metal layer 102 is separated from the second metal layer 103. The second metal layer 103, the etching barrier layer 104 and the first metal seed layer 105 are removed. In some embodiments, the first metal layer on the separated surface is removed typically by etching, the etching barrier layer is removed typically by etching with a specific solution, wherein the solution is preferably a nickel etchant, and the first metal seed layer is removed typically by etching.

Figure 10:
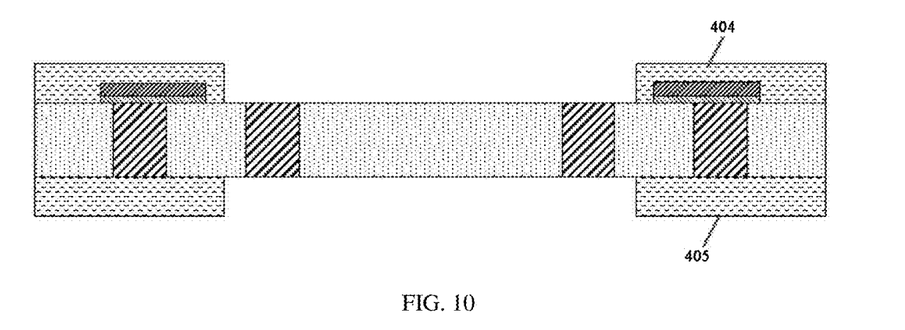

Further, with reference to FIG. 10, photoresist materials are applied on both sides, which may be realized by pasting or coating, the photoresist materials are exposed and developed to form a third photoresist layer 404 and a fourth photoresist layer 405, with the first circuit layer and the conductive copper column 501 being covered and the sacrificial copper column 302 being exposed.

Figure 11:
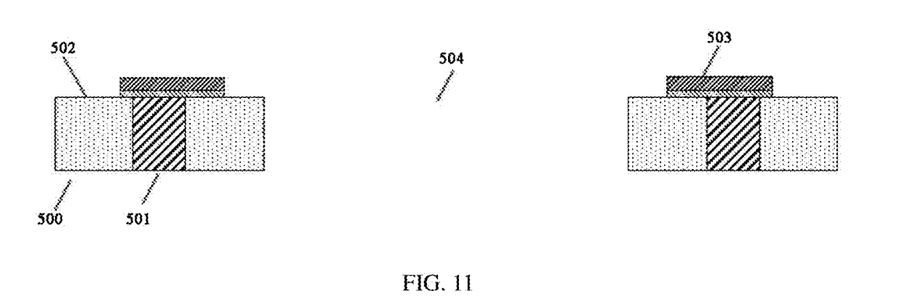

Further, with reference to FIG. 11, the sacrificial copper column 302 is removed to form the chip-embedded cavity 504, and the substrate 500 including the conductive copper column 501, the first insulating layer 502, the first circuit layer 503 and the chip-embedded cavity 504 is obtained. In some embodiments, the sacrificial copper column is removed by etching, and the third photoresist layer and the fourth photoresist layer may be removed by stripping.

Figure 12:
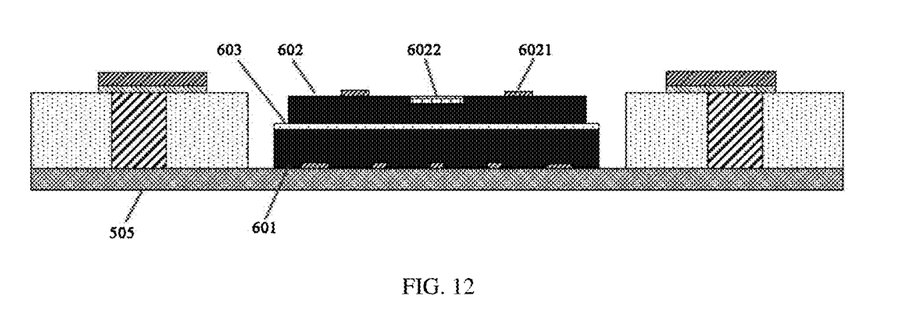

In S200, with reference to FIG. 12, a supporting member 505 is arranged on a bottom of the substrate 500, wherein the supporting member 505 is configured for pre-fixing an electronic device assembly. In some embodiments, the supporting member 505 may be an adhesive tape, and an adhesive surface of the adhesive tape is helpful for pre-fixing the electronic device.

In S300, the electronic device assembly is pre-fixed on an inner side of the supporting member 505 corresponding to the chip-embedded cavity 504, wherein the electronic device assembly includes a first electronic device 601 and a second electronic device 602, the second electronic device 602 is arranged on a back surface of the first electronic device 601, a terminal surface of the first electronic device 601 faces the supporting member, and a terminal surface of the second electronic device faces away from the first electronic device 601. In some embodiments, the first electronic device 601 and the second electronic device 602 may be adhered through an adhesive material 603, and the electronic devices may be adhered by sequentially adhering the first electronic device 601, the adhesive material 603 and the second electronic device 602, or directly adhering a combined entirety of the first electronic device 601, the adhesive material 603 and the second electronic device 602, which means that, the first electronic device 601, the adhesive material and the second electronic device 602 are combined into an entirety in advance, and then the entirety is adhered on the adhesive tape 505.

Figure 13:
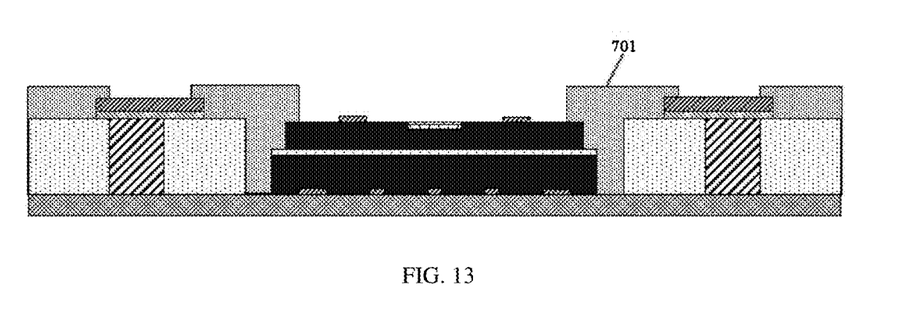

In S400, with reference to FIG. 13, the electronic device assembly is packaged, and a part of the first circuit layer 503 and a terminal of the second electronic device are exposed to form a second insulating layer 701. In some embodiments, a photosensitive insulating material may be used for packaging a chip, then the photosensitive insulating material is exposed and developed, and a part of the first circuit layer and the terminal of the second electronic device are exposed to form the second insulating layer 701. Certainly, an ordinary non-photosensitive insulating material may also be used for packaging by vacuum pressing, laminating and coating, and then the insulating material is removed by laser and plasma etching to form a window. The packaging may also be performed by local injection molding and a window is formed to expose a part of the terminal.

Figure 14:
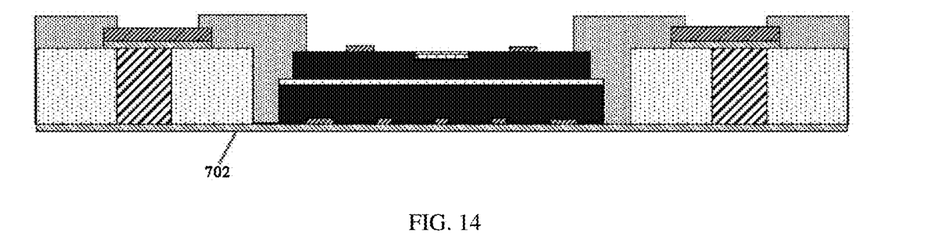

In S500, with reference to FIG. 14, the supporting member 505 is removed. In some embodiments, after the supporting member 505 is removed, a third metal seed layer 702 is manufactured on the bottom surface of the substrate 500 first to prepare for manufacturing of the second circuit layer. The third metal seed layer 702 may be subjected to copper plating or ion sputtering, and the third metal seed layer may be Cu or Ti+Cu.

Figure 15:
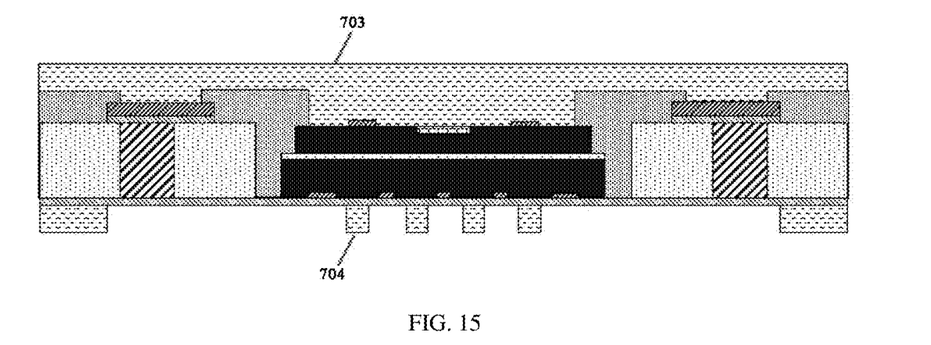
Figure 16:
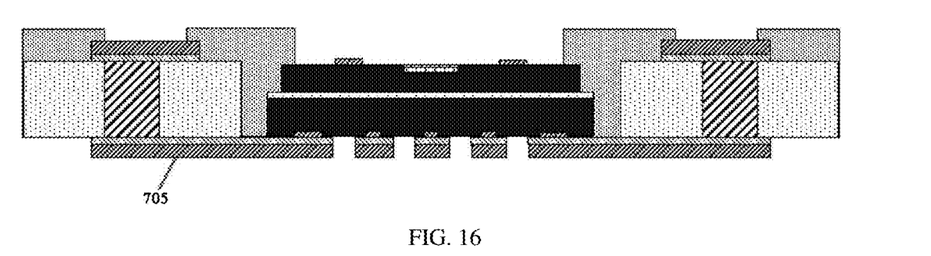
Figure 17:
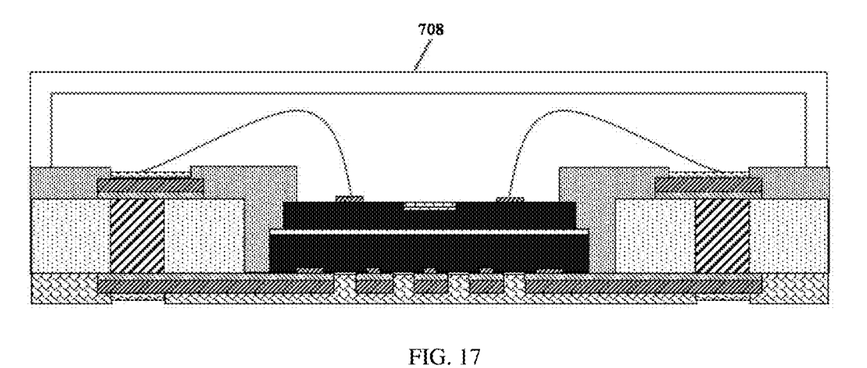

In S600, with reference to FIG. 15, FIG. 16 and FIG. 17, a second circuit layer 705 and a solder mask 706 are manufactured on the bottom of the substrate 500, which includes:
applying photoresist materials on both sides, which may be realized by pasting or coating;
exposing and developing the photoresist materials, to form a fifth photoresist layer 703 and a sixth photoresist layer 704 by fully covering the top surface and manufacturing a second circuit layer pattern on the bottom surface;
electroplating a second circuit, with a thickness defined according to actual requirements, which is typically lower than that of the sixth photoresist layer;
removing the fifth photoresist layer and the sixth photoresist layer, which may typically be realized by stripping;
etching the metal seed layer to remove the exposed third metal seed layer to form the second circuit layer 705; and
manufacturing the solder mask 706 on the bottom surface. The solder mask may be manufactured as required.

In S700, surfaces of the first circuit layer 503 and the second circuit layer 705 are processed to form respective surface-processed layers 707, which may be antioxidation, nickel palladium plating, tin plating or silver plating. When the surfaces are processed, it is typically necessary to shield a window location in a chip area.

Figure 18:
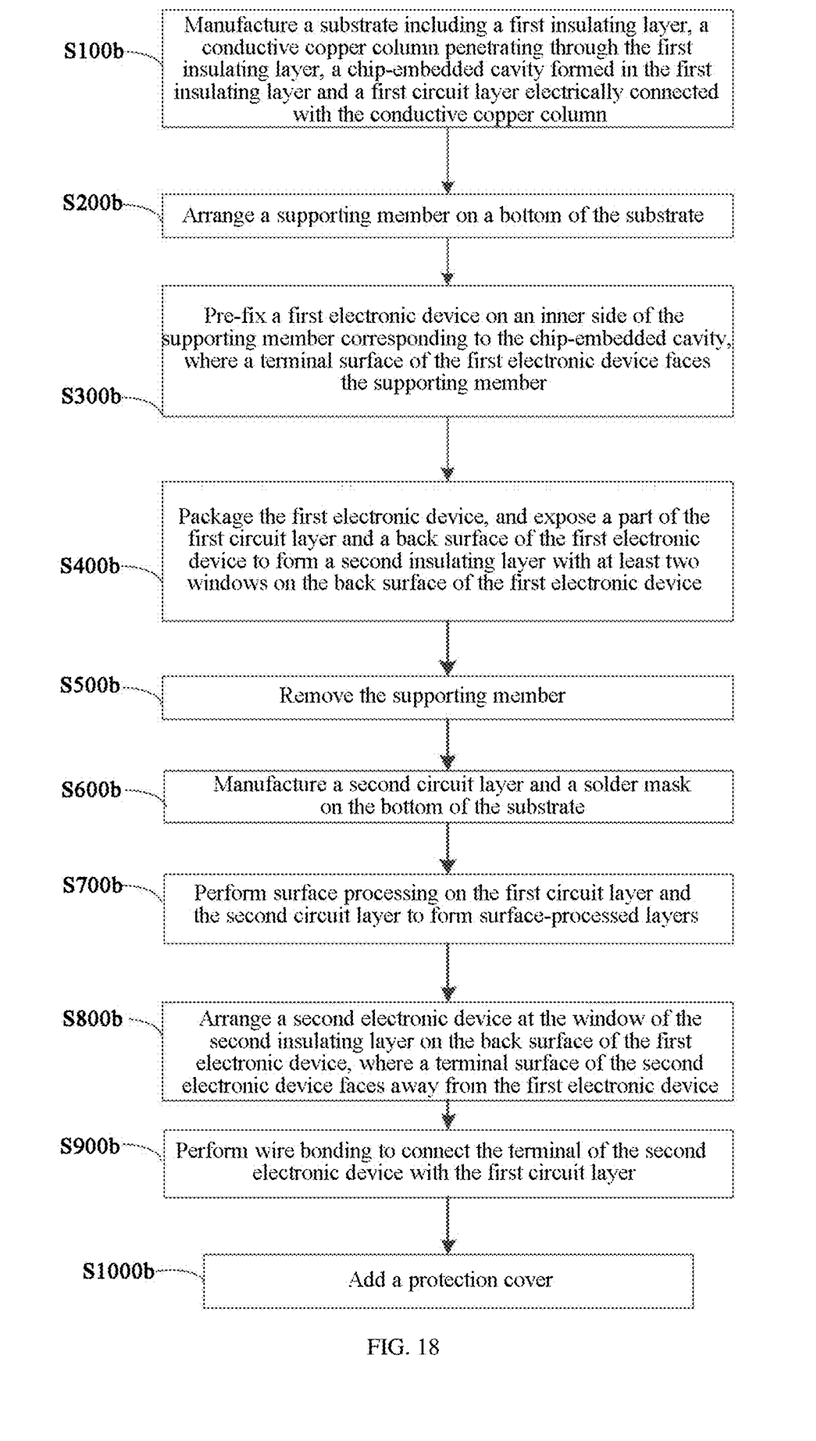
FIG. 18 is a flow chart of steps of a manufacturing method of a hybrid embedded packaging structure provided by a second embodiment of the disclosure.

In S800, with reference to FIG. 18, wire bonding is performed to connect the terminal 6021 of the second electronic device with the first circuit layer 503, which may be realized by gold wire bonding and copper wire bonding.

In S900, a protection cover is added, and the protection cover 708 is added on the top surface after wire bonding. In some embodiments, a transparent glass material may be selected, such that when the second electronic device has a sensor or is a light emitting device such as an LED, the package can be protected without affecting operations of the sensor or the LED.

In the manufacturing method of a hybrid embedded packaging structure according to embodiments in the first aspect of the disclosure, embedded packaging is combined with WB packaging, and the embedded packaging or the WB packaging (wire bonding) can be selectively performed on a chip and other components to be packaged. For a chip with a large number of I/O, the WB packaging has high difficulty and high cost, so that the embedded packaging may be selected. For a chip with a small number of I/O, the embedded packaging has a long processing period and a high cost, so that the WB may be selected. For special applications of special devices, such as LED, photodiode and other devices involving light emitting from a light source or light receiving, the WB may be selected to expose the devices for photoelectric induction. Meanwhile, according to a WB packaging structure in the technical solution of the disclosure, an electronic device such as a chip to be subjected to WB is fixed on a back surface of an electronic device such as a chip embedded, and then wire bonding is performed to electrically connect the electronic device such as the chip subjected to WB with the substrate. Compared with a traditional method of attaching the device to be subjected to WB on the surface of the substrate and then performing wire bonding, this structure can reduce a packaging volume, and meet the development requirements of high-density integration and miniaturization of the package.

In some embodiments, a terminal board of the second electronic device 602 is further provided with a sensor 6022 which needs to be exposed after the electronic device assembly is packaged.

In some embodiments, the first insulating layer may be made of a pure resin or an organic insulating material containing a resin and a glass fiber.

With reference to FIG. 17, another embodiment of the disclosure provides a manufacturing method of a hybrid embedded packaging structure, wherein the first two steps are the same as those in the first embodiment, and the manufacturing method specifically includes the following steps.

In S100b, a substrate 500 is manufactured, wherein the substrate includes a first insulating layer 502, a conductive copper column 501 penetrating through the first insulating layer 502, a chip-embedded cavity 504 formed in the first insulating layer 502 and a first circuit layer 503 electrically connected with the conductive copper column 501.

In S200b, a supporting member 505 is arranged on a bottom of the substrate 500.

Figure 19:
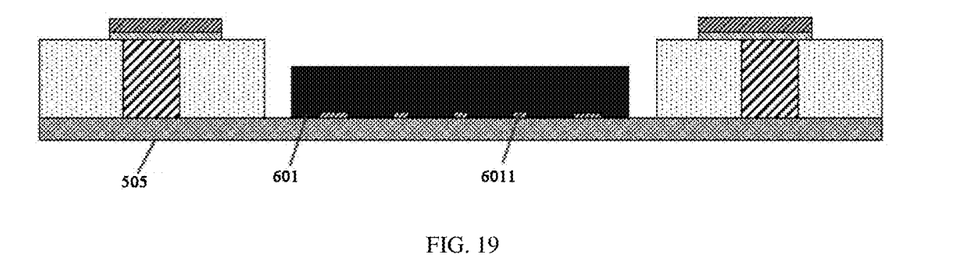
FIG. 19 to FIG. 25 are cross-sectional views of a manufacturing method of a packaging substrate provided by the second embodiment of the disclosure.

In S300b, with reference to FIG. 19, a first electronic device 601 is pre-fixed on an inner side of the supporting member 505 corresponding to the chip-embedded cavity 504, wherein a terminal surface 6011 of the first electronic device 601 faces the supporting member.

Figure 20:
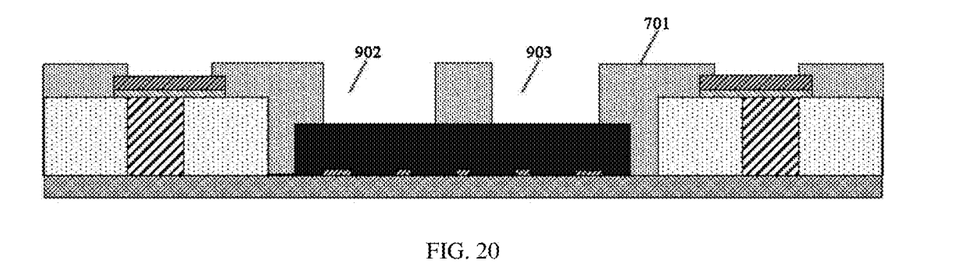

In S400b, with reference to FIG. 20, the electronic device assembly 601 is packaged, and a part of the first circuit layer 503 and a back surface of the first electronic device are exposed to form a second insulating layer, wherein the second insulating layer is provided with at least two windows on the back surface of the first electronic device. In the embodiment, a photosensitive insulating material is specifically used for packaging a chip, then the photosensitive insulating material is exposed and developed, and the part of the first circuit layer and the back surface of the first electronic device are exposed to form the second insulating layer 701. The second insulating layer is provided with two windows on the back surface of the first electronic device, which are window 902 and window 903 respectively, and it should be noted that the number of windows is not limited to two, and there may also be more than two windows, which is defined according actual requirements. Arrangement of two windows is taken as an example in the embodiment. Certainly, an ordinary non-photosensitive insulating material may also be used for packaging by vacuum pressing, laminating and coating, and then the insulating material is removed by laser and plasma etching to form the windows. The packaging may also be performed by local injection molding and the windows are formed to expose a part of the terminal.

Figure 21:
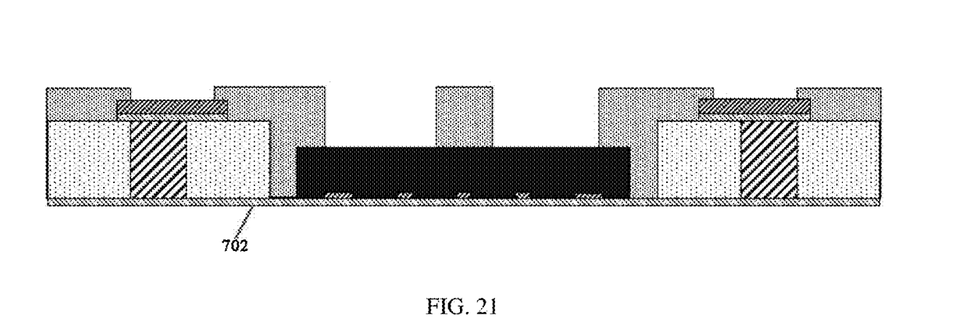

In S500b, further, with reference to FIG. 21, the supporting member 505 is removed, and a third metal seed layer 702 is manufactured on the bottom surface of the substrate, which may be realized by copper plating or ion sputtering. The third metal seed layer may be Cu or Ti+Cu.

Figure 22:
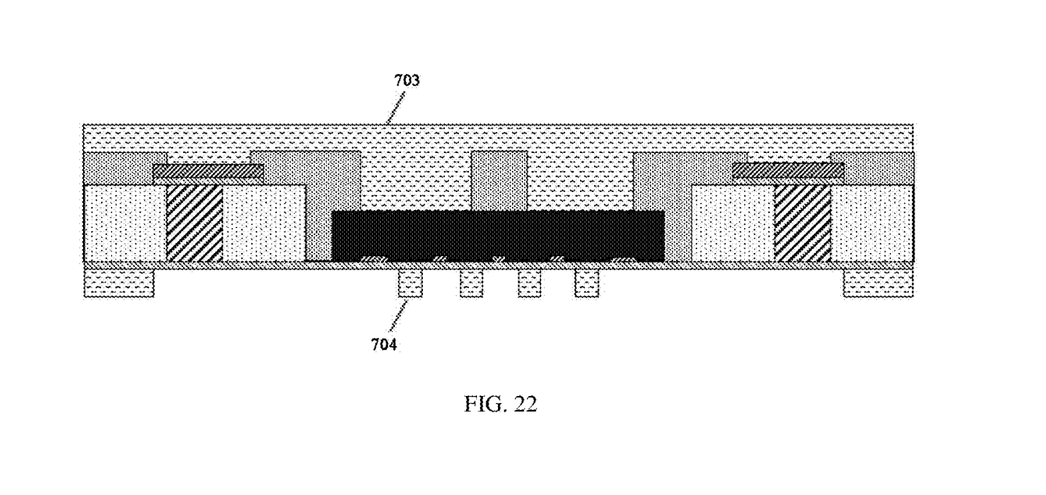
Figure 23:
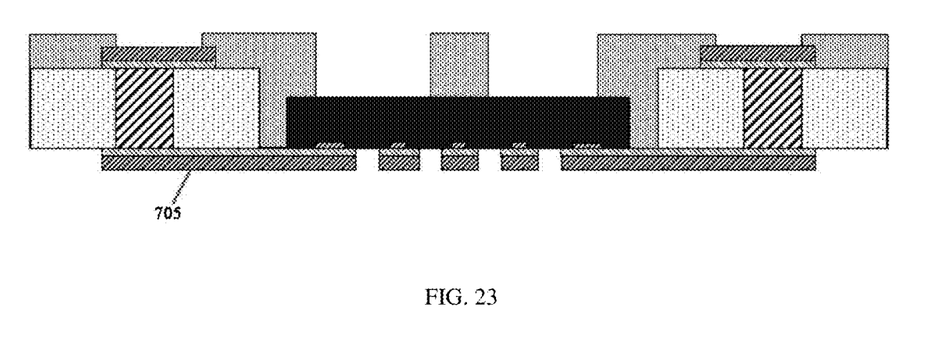
Figure 24:
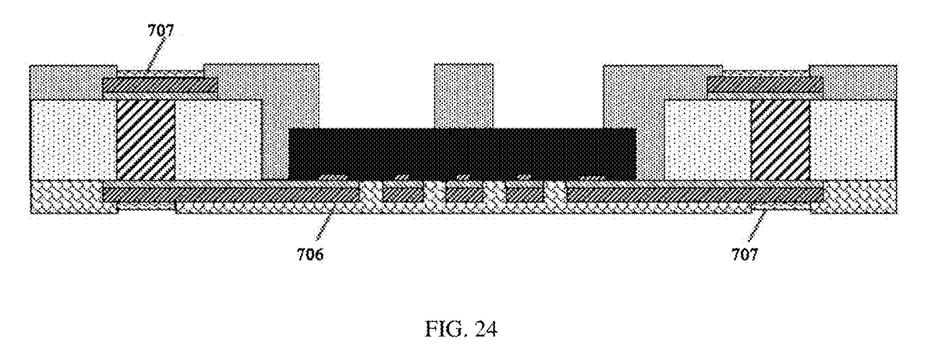

In S600b, with reference to FIG. 22, FIG. 23 and FIG. 24, a second circuit layer 705 and a solder mask 706 are manufactured on the bottom of the substrate 500, which specifically includes:

applying photoresist materials on both sides, which may be realized by pasting or coating;

exposing and developing the photoresist materials, to form a fifth photoresist layer 703 and a sixth photoresist layer 704 by fully covering the top surface and manufacturing a second circuit layer pattern on the bottom surface;

electroplating a second circuit, with a thickness defined according to actual requirements, which is typically lower than that of the sixth photoresist layer;

removing the fifth photoresist layer and the sixth photoresist layer, which may typically be realized by stripping;

etching the metal seed layers to remove the exposed third metal seed layer to form the second circuit layer 705; and manufacturing the solder mask 706 on the bottom surface.

In S700b, surfaces of the first circuit layer 503 and the second circuit layer 705 are processed to form surface-processed layers, which means that selective surface processing is performed on both sides to form the surface-processed layers 707, which may be antioxidation, nickel palladium plating, tin plating or silver plating. When the surfaces are processed, it is typically necessary to shield a window location in a chip area.

Figure 25:
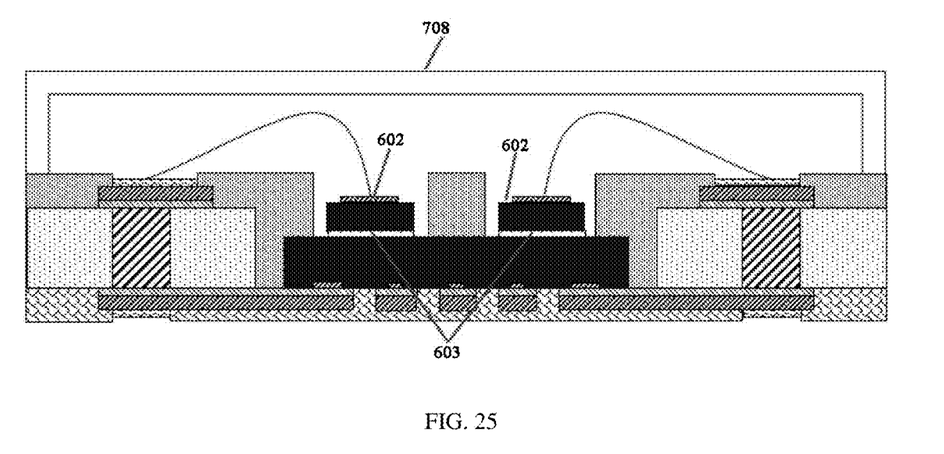

In S800b, with reference to FIG. 25, a second electronic device 602 is arranged at the window of the second insulating layer on the back surface of the first electronic device, wherein a terminal surface of the second electronic device faces away from the first electronic device 601, which specifically includes: applying an adhesive material 603 to each window of the second insulating layer on the back surface of the first electronic device, and adhering the second electronic devices 602 respectively. The second electronic devices 602 may be same electronic devices or different electronic devices according to actual situation. Two different electronic devices are provided in the embodiment, one electronic device is a LED chip, the other electronic device is a photodiode PD, and back surfaces of the two different second electronic devices are tightly attached with the back surface of the first electronic device through the adhesive material.

In S900b, wire bonding is performed to connect the terminal of the second electronic device with the first circuit layer 503.

In S1000b, a protection cover 708 is added.

Figure 26:
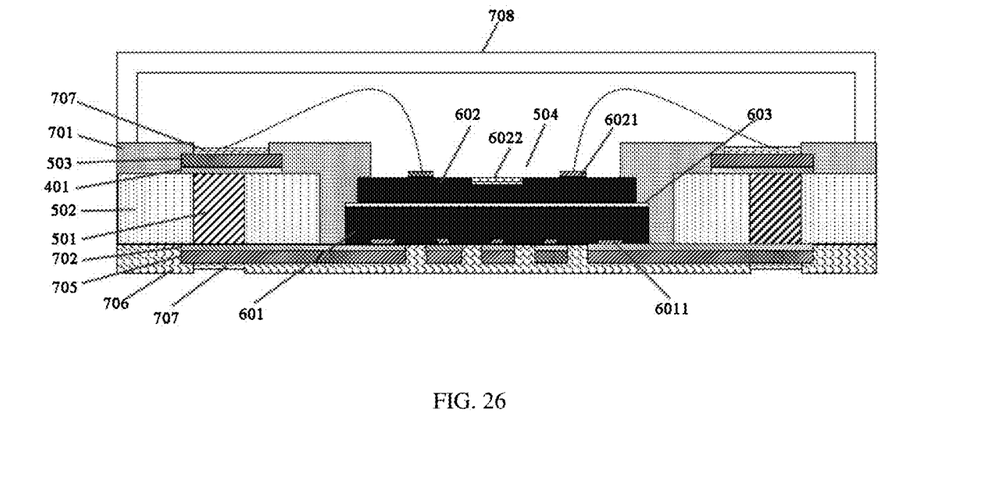
FIG. 26 is a cross-sectional view of the packaging substrate provided by the first embodiment of the disclosure.

With reference to FIG. 26, an embodiment of the disclosure provides a hybrid embedded packaging structure, which includes:

a substrate, wherein the substrate includes a first insulating layer 502, a conductive copper column 501 penetrating through the first insulating layer 502, a chip-embedded cavity 504 formed in the first insulating layer 502 and a first circuit layer 503 electrically connected with the conductive copper column 501;

a first electronic device 601 arranged inside the chip-embedded cavity 504, wherein a terminal surface of the first electronic device 601 faces a bottom surface of the substrate;

a second electronic device 602 arranged on a back surface of the first electronic device 601, wherein a terminal surface of the second electronic device faces a top surface of the substrate;

a second insulating layer 503 covering and filling the chip-embedded cavity 504 and an upper layer of the substrate, and exposing a part of a first circuit layer 503 and a back surface of a part of the second electronic device 602 or a part of the first electronic device;

a second circuit layer 705 arranged on the bottom surface of the substrate 500, wherein the second circuit layer 705 is electrically connected with the conductive copper column 501 and a terminal 6011 of the first electronic device 601; and a conducting wire electrically connecting the first circuit layer 503 with a terminal 6021 of the second electronic device 602.

In the hybrid embedded packaging structure according to embodiments of the disclosure, embedded packaging is combined with WB packaging, and the embedded packaging or the WB packaging (wire bonding) is selectively performed on an electronic device and other components to be packaged, which can reduce a production cost and shorten a processing period. A sensor and a light sensing device (LED and PD) may be integrated inside the substrate, and the sensor and the light sensing device may be exposed, so that a packaging volume can be reduced, without affecting signal sending/receiving of the sensor and the light sensing device.

The second electronic device to be subjected to WB is fixed on the back surface of the embedded first electronic device, and then the second electronic device subjected to WB is electrically connected with the substrate by wire bonding.

In some embodiments, one second electronic device 602 is provided, and the second insulating layer 503 covers and fills the chip-embedded cavity 504 and the upper layer of the substrate, and exposes a part of the first circuit layer 503 and the terminal of the second electronic device 602.

In some embodiments, the terminal surface of the second electronic device 602 is further provided with a sensor, and the second insulating layer 503 covers and fills the chip-embedded cavity 504 and the upper layer of the substrate, and exposes a part of the first circuit layer 503, the terminal of the second electronic device 602 and the sensor.

In some embodiments, the hybrid embedded packaging structure further includes a second metal seed layer 401 and a third metal seed layer 702, wherein the second metal seed layer 401 is arranged between the conductive copper column 501 and the first circuit layer 503, and the third metal seed layer 702 is arranged between the conductive copper column 501 and the second circuit layer 705.

Figure 27:
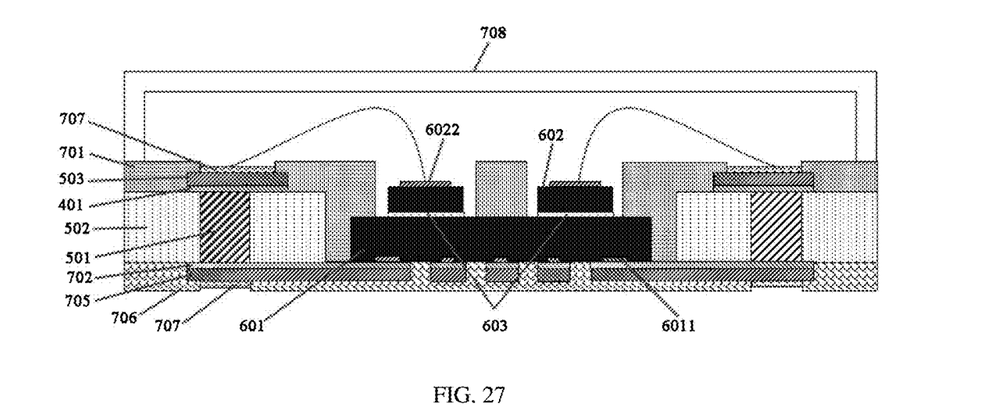
FIG. 27 is a cross-sectional view of the packaging substrate provided by the second embodiment of the disclosure.

In some embodiments, further, with reference to FIG. 27, at least two second electronic devices 602 are provided, the second insulating layer 503 covers and fills the chip-embedded cavity 504 and the upper layer of the substrate, and exposes a part of the first circuit layer 503 and a back surface of a part of the first electronic device 601, the second insulating layer 503 is provided with at least two windows on the back surface of the first electronic device 601, and each second electronic device 602 is arranged in the corresponding window. A plurality of second electronic devices to be subjected to WB may be provided as required, a type of each electronic device may be arbitrarily matched, and the types may be the same or different, thus having a very flexible design.

In some embodiments, when at least two second electronic devices 602 are provided, the at least two second electronic devices 602 are same electronic components or different electronic components.

In some embodiments, the second electronic device is arranged on the back surface of the first electronic device 601 through an adhesive material.

In some embodiments, the hybrid embedded packaging structure further includes a solder mask 706 at least partially covering the second circuit layer 705.

In some embodiments, the hybrid embedded packaging structure further includes a protection cover 708, which is arranged on the top surface of the substrate 500 to further protect the package. In order to avoid affecting operations of electronic devices such as LED and PD, the protection cover may also be a light-transmitting cover such as a glass light-transmitting cover, or a plastic light-transmitting cover.

The foregoing describes some embodiments of the disclosure in detail, but the disclosure is not limited to the above embodiments. Those of ordinary skills in the art may further make various equivalent modifications or substitutions without violating the gist of the disclosure, and these equivalent modifications or substitutions are included in the scope defined by the claims of the disclosure.

The invention claimed is:

1. A manufacturing method of a hybrid embedded packaging structure, comprising:
   manufacturing a substrate, wherein the substrate comprises a first insulating layer, a conductive copper column penetrating through the first insulating layer, a chip-embedded cavity formed in the first insulating layer and a first circuit layer electrically connected with the conductive copper column;
   arranging a supporting member on a bottom of the substrate, wherein the supporting member is configured for pre-fixing an electronic device assembly;
   pre-fixing the electronic device assembly on an inner side of the supporting member corresponding to the chip-embedded cavity, wherein the electronic device assembly comprises a first electronic device and a second electronic device, the second electronic device is arranged on a back surface of the first electronic device, a terminal surface of the first electronic device faces the supporting member, and a terminal surface of the second electronic device faces away from the first electronic device;
   packaging the electronic device assembly, with a part of the first circuit layer and a terminal of the second electronic device exposed to form a second insulating layer;
   removing the supporting member;
   manufacturing a second circuit layer on the bottom of the substrate; and
   performing wire bonding to connect the terminal of the second electronic device with the first circuit layer, wherein manufacturing the substrate comprises:
      preparing a bearing plate, wherein the bearing plate sequentially comprises a core layer, a first metal layer, a second metal layer, an etching barrier layer and a first metal seed layer from bottom to top;
      manufacturing a first photoresist layer on a surface of the first metal seed layer, wherein the first photoresist layer is provided with a conductive copper column window and a sacrificial copper column window;
      respectively manufacturing a conductive copper column and a sacrificial copper column at positions corresponding to the conductive copper column window and the sacrificial copper column window;
      removing the first photoresist layer;
      forming the first insulating layer by laminating which covers the copper columns and is thinned to exposed end portions of the conductive copper column and the sacrificial copper column;
      manufacturing a second metal seed layer on a surface where the copper columns are exposed;
      forming a second photoresist layer by applying a photoresist material on a surface of the second metal seed layer, exposing and developing the photoresist material, and manufacturing a first circuit layer pattern;
      electroplating a circuit, and removing the second photoresist layer and an exposed part of the second metal seed layer to form the first circuit layer;
      splitting the first metal layer from the second metal layer;
      removing the second metal layer, the etching barrier layer and the first metal seed layer;
      applying photoresist materials on both sides, exposing and developing the photoresist materials to form a third photoresist layer and a fourth photoresist layer, with the first circuit layer and the conductive copper column being covered and the sacrificial copper column being exposed; and
      removing the sacrificial copper column to form the chip-embedded cavity.

2. The manufacturing method of a hybrid embedded packaging structure of claim 1, further comprising:
   after manufacturing a second circuit layer, manufacturing a solder mask on the bottom of the substrate and a surface of at least a part of the second circuit layer; and performing surface processing on the first circuit layer and the second circuit layer to form respective surface-processed layers.

3. The manufacturing method of a hybrid embedded packaging structure of claim 1, further comprising adding a protection cover on a top surface of the substrate.

4. The manufacturing method of a hybrid embedded packaging structure of claim 1, wherein the first electronic device and the second electronic device are connected through an adhesive material.

5. The manufacturing method of a hybrid embedded packaging structure of claim 1, wherein a terminal board of the second electronic device is further provided with a sensor.

6. The manufacturing method of a hybrid embedded packaging structure of claim 5, wherein packaging the electronic device assembly, with a part of the first circuit layer and a terminal of the second electronic device exposed to form a second insulating layer, comprises:

packaging the electronic devices with an insulating material; and processing the insulating material to expose the part of the first circuit layer, the terminal of the second electronic device and the sensor to form the second insulating layer.

7. The manufacturing method of a hybrid embedded packaging structure of claim 6, wherein the insulating material for the second insulating layer is a photosensitive insulating material, and by exposing and developing the photosensitive insulating material, the part of the first circuit layer, the terminal of the second electronic device and the sensor are exposed to form the second insulating layer.

8. The manufacturing method of a hybrid embedded packaging structure of claim 1, wherein manufacturing a second circuit layer on the bottom of the substrate comprises:

manufacturing a third metal seed layer on a bottom surface of the substrate;

applying photoresist materials on both sides by pasting or coating;

forming a fifth photoresist layer and a sixth photoresist layer by exposing and developing the photoresist materials to fully covering a top surface and form a second circuit layer pattern on the bottom surface;

electroplating a second circuit;

removing the fifth photoresist layer and the sixth photoresist layer; and forming the second circuit layer by etching the metal seed layer to remove a exposed part of the third metal seed layer.

9. The manufacturing method of a hybrid embedded packaging structure of claim 1, wherein the first insulating layer is made of a pure resin or an organic insulating material containing a resin and a glass fiber.

10. A manufacturing method of a hybrid embedded packaging structure, comprising:

manufacturing a substrate, wherein the substrate comprises a first insulating layer, a conductive copper column penetrating through the first insulating layer, a chip-embedded cavity formed in the first insulating layer and a first circuit layer electrically connected with the conductive copper column;

arranging a supporting member on a bottom of the substrate;

pre-fixing a first electronic device on an inner side of the supporting member corresponding to the chip-embedded cavity, wherein a terminal surface of the first electronic device faces the supporting member;

packaging the first electronic device, with a part of the first circuit layer and a back surface of the first electronic device exposed to form a second insulating layer, wherein the second insulating layer is provided with at least two windows on the back surface of the first electronic device;

removing the supporting member;

manufacturing a second circuit layer on the bottom of the substrate; and arranging a second electronic device at the window of the second insulating layer on the back surface of the first electronic device, wherein a terminal surface of the second electronic device faces away from the first electronic device; and performing wire bonding to connect a terminal of the second electronic device with the first circuit layer, wherein manufacturing the substrate comprises:

preparing a bearing plate, wherein the bearing plate sequentially comprises a core layer, a first metal layer, a second metal layer, an etching barrier layer and a first metal seed layer from bottom to top;

manufacturing a first photoresist layer on a surface of the first metal seed layer, wherein the first photoresist layer is provided with a conductive copper column window and a sacrificial copper column window;

respectively manufacturing a conductive copper column and a sacrificial copper column at positions corresponding to the conductive copper column window and the sacrificial copper column window;

removing the first photoresist layer;

forming the first insulating layer by laminating which covers the copper columns and is thinned to exposed end portions of the conductive copper column and the sacrificial copper column;

manufacturing a second metal seed layer on a surface where the copper columns are exposed;

forming a second photoresist layer by applying a photoresist material on a surface of the second metal seed layer, exposing and developing the photoresist material, and manufacturing a first circuit layer pattern;

electroplating a circuit, and removing the second photoresist layer and an exposed part of the second metal seed layer to form the first circuit layer;

splitting the first metal layer from the second metal layer;

removing the second metal layer, the etching barrier layer and the first metal seed layer;

applying photoresist materials on both sides, exposing and developing the photoresist materials to form a third photoresist layer and a fourth photoresist layer, with the first circuit layer and the conductive copper column being covered, and the sacrificial copper column being exposed; and removing the sacrificial copper column to form the chip-embedded cavity.

11. A hybrid embedded packaging structure, comprising:

a substrate, wherein the substrate comprises a first insulating layer, a conductive copper column penetrating through the first insulating layer, a chip-embedded cavity formed in the first insulating layer and a first circuit layer electrically connected with the conductive copper column;

a first electronic device arranged inside the chip-embedded cavity, wherein a terminal surface of the first electronic device faces a bottom surface of the substrate;

a second electronic device arranged on a back surface of the first electronic device, wherein a terminal surface of the second electronic device faces a top surface of the substrate;

a second insulating layer covering and filling the chip-embedded cavity and an upper layer of the substrate, and exposing a part of the first circuit layer and a back surface of a part of the second electronic device or a part of the first electronic device;

a second circuit layer arranged on the bottom surface of the substrate, wherein the second circuit layer is electrically connected with the conductive copper column and a terminal of the first electronic device; and a conducting wire electrically connecting the first circuit layer with a terminal of the second electronic device, wherein the second electronic device comprises one second electronic device, and the second insulating layer covers and fills the chip-embedded cavity and the upper layer of the substrate, and exposes the part of the first circuit layer and the terminal of the second electronic device;

wherein the terminal surface of the second electronic device is further provided with a sensor, and the second insulating layer covers and fills the chip-embedded cavity and the upper layer of the substrate, and exposes the part of the first circuit layer, the terminal of the second electronic device and the sensor.

12. The hybrid embedded packaging structure of claim 11, wherein the second electronic device comprises at least two second electronic devices, the second insulating layer covers and fills the chip-embedded cavity and the upper layer of the substrate, and exposes the part of the first circuit layer and a back surface of the part of the first electronic device, the second insulating layer is provided with at least two windows on the back surface of the first electronic device, and each second electronic device is arranged in the corresponding window.

13. The hybrid embedded packaging structure of claim 12, wherein the at least two second electronic devices are same electronic components or different electronic components.

14. The hybrid embedded packaging structure of claim 11, wherein the second electronic device is arranged on the back surface of the first electronic device through an adhesive material.

15. The hybrid embedded packaging structure of claim 11, further comprising a solder mask at least partially covering the second circuit layer.

16. The hybrid embedded packaging structure of claim 11, further comprising a protection cover arranged on the top surface of the substrate.

17. The hybrid embedded packaging structure of claim 16, wherein the protection cover is a light-transmitting cover.

* * * * *